United States Patent
Lee et al.

(10) Patent No.: US 6,872,510 B2
(45) Date of Patent: Mar. 29, 2005

(54) PHOTOMASK HAVING SMALL PITCH IMAGES OF OPENINGS FOR FABRICATING OPENINGS IN A SEMICONDUCTOR MEMORY DEVICE AND A PHOTOLITHOGRAPHIC METHOD FOR FABRICATING THE SAME

(75) Inventors: Jung-Woo Lee, Suwon (KR); Hak Kim, Yongin (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/391,909

(22) Filed: Mar. 19, 2003

(65) Prior Publication Data

US 2003/0180668 A1 Sep. 25, 2003

Related U.S. Application Data

(62) Division of application No. 09/783,064, filed on Feb. 14, 2001, now Pat. No. 6,582,860.

(30) Foreign Application Priority Data

Feb. 15, 2000 (KR) .............................................. 00-7121

(51) Int. Cl.[7] ................................................. G03C 5/00
(52) U.S. Cl. ...................................... 430/311; 430/394
(58) Field of Search .................................. 430/311, 322, 430/330, 396, 394

(56) References Cited

U.S. PATENT DOCUMENTS

| 4,762,805 A | * | 8/1988 | Cheung et al. .............. 438/400 |
| 5,691,551 A | | 11/1997 | Eimori ........................ 257/303 |
| 6,284,438 B1 | | 9/2001 | Choi et al. ................... 430/322 |
| 6,566,041 B2 | * | 5/2003 | Iwasaki et al. .............. 430/322 |

FOREIGN PATENT DOCUMENTS

| KR | P1995-0019907 | 7/1995 | ........... G03F/1/100 |
| KR | P1996-0012292 | 4/1996 | ......... H01L/21/027 |
| KR | P1997-0002487 | 1/1997 | ............. G03F/7/20 |

* cited by examiner

Primary Examiner—S. Rosasco
(74) Attorney, Agent, or Firm—Mills & Onello LLP

(57) ABSTRACT

A photomask having small pitch images of openings for fabricating an opening of a semiconductor memory device includes a plurality of images of openings arranged in a row direction with a predetermined pitch to be used to transfer the images of openings onto a photoresist layer, and is used for a photolithographic process employing a photoresist flow process. The distance between the centers of the images of openings arranged in the photomask is larger than the pitch. A photolithographic method for fabricating reduced size openings and a semiconductor memory device having openings fabricated using the same method is also provided.

7 Claims, 6 Drawing Sheets

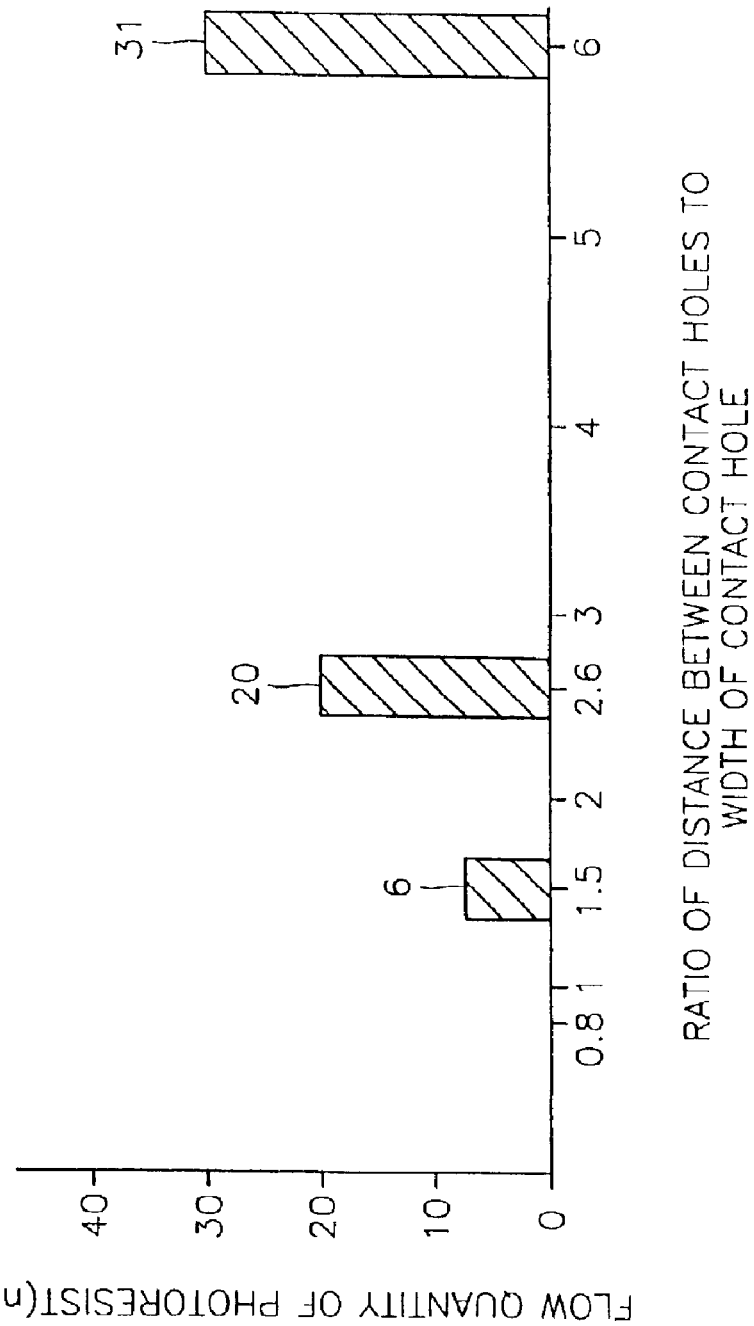

PHOTOMASK HAVING SMALL PITCH IMAGES OF OPENINGS FOR FABRICATING OPENINGS IN A SEMICONDUCTOR MEMORY DEVICE AND A PHOTOLITHOGRAPHIC METHOD FOR FABRICATING THE SAME

RELATED APPLICATIONS

This application is a divisional application of U.S. Ser. No. 09/783,064, filed Feb. 14, 2001, now U.S. Pat. No. 6,582,860, the content of which is incorporated herein by reference.

BACKGROUND OF THE INVENTION

1. Field of the Invention

The present invention relates to a photomask having small pitch images of openings for fabricating an opening of a semiconductor memory device, a photolithographic method using the same, and a semiconductor memory device fabricated using the same method.

2. Description of the Related Art

As semiconductor memory devices become more highly integrated, the line width of interconnections becomes reduced. Due to reduction of the line width of interconnections, the size of openings for electrically connecting conductive regions and interconnections, that is, the size and the pitch of contact holes or via holes, also becomes reduced. However, due to optical limitations, when ultraviolet light having a wavelength of 365 nm (i-line UV) is used as a light source, the resolution limit of a square opening is 0.35 $\mu$m, and 0.30 $\mu$m in the case of deep ultraviolet (DUV).

Thus, a photoresist flow process has been introduced as a method for forming small openings below the resolution limit. The photoresist flow process comprises the steps of: projecting the images of openings of a photomask on a photoresist layer; and reducing the size of the images of openings by applying thermal energy for a given time to reach a temperature above the glass transition temperature of the photoresist, and then flowing the photoresist.

However, in order to apply the photoresist flow process, a given quantity of the photoresist should exist between the images of openings. For example, in a case where the photoresist layer is formed to a thickness between about 0.8 $\mu$m and about 1.2 $\mu$m, the photoresist is flowed only when the distance between the images of openings is at least 0.25 $\mu$m. This means that the photoresist can be flowed only when a given quantity of photoresist exists around the images of openings.

However, in conventional high-integration devices, the openings are very small, the pitch between the openings is also small, and the quantity of photoresist required to apply the photoresist flow process does not exist around the openings, therefore, it is not possible for the photoresist flow process to be applied.

SUMMARY OF THE INVENTION

To address the above limitations, it is an object of the present invention to provide a photomask capable of forming small pitch openings by having images of openings arranged for application of a photoresist flow process.

It is another object of the present invention to provide a photolithographic method capable of forming small pitch openings.

It is still another object of the present invention to provide a semiconductor memory device having such small pitch openings.

Accordingly, to achieve the first object, there is provided a photomask for fabricating an opening of a semiconductor memory device having a plurality of images of openings arranged in a row direction at a predetermined pitch, and for transferring the images of openings onto a photoresist layer, and the photomask is used for a photolithographic process employing a photoresist flow process, and the distance between the centers of the images of openings is larger than the pitch.

The pitch is so small that the photoresist layer having the transferred images of openings can not be flowed when the images of openings are arranged in one direction with the pitch and transferred onto the photoresist layer.

In order to achieve the second object, there is provided a photolithographic method for fabricating an opening of a semiconductor memory device, the method comprising the steps of: forming a photoresist layer having a plurality of images of openings arranged in a row direction with a predetermined pitch, wherein the distance between the centers of the images of openings is larger than the pitch; reducing the size of the images of openings by flowing the photoresist layer; and forming reduced size openings by using the reduced size openings images of the flowed photoresist layer.

In order to achieve the third object, there is provided a semiconductor memory device, which is a non-volatile memory device or a dynamic random access memory (DRAM) device having a reduced size opening fabricated by the photolithographic method. In the case of the non-volatile memory device, the opening is a bit line contact hole. In the case of the DRAM device, the opening is a storage electrode contact hole.

BRIEF DESCRIPTION OF THE DRAWINGS

The above objects and advantages of the present invention will become more apparent by describing in detail preferred embodiments thereof with reference to the attached drawings in which:

FIG. 2A is a sectional view taken along line A–A' of FIG. 1, and FIG. 2B is a sectional view taken along line B–B' of FIG. 1;

FIG. 6 is a histogram of results illustrating the ratio of the distance between contact holes to the width of a contact hole and the flow quantity of a photoresist.

DETAILED DESCRIPTION OF PREFERRED EMBODIMENTS

Figure 1:
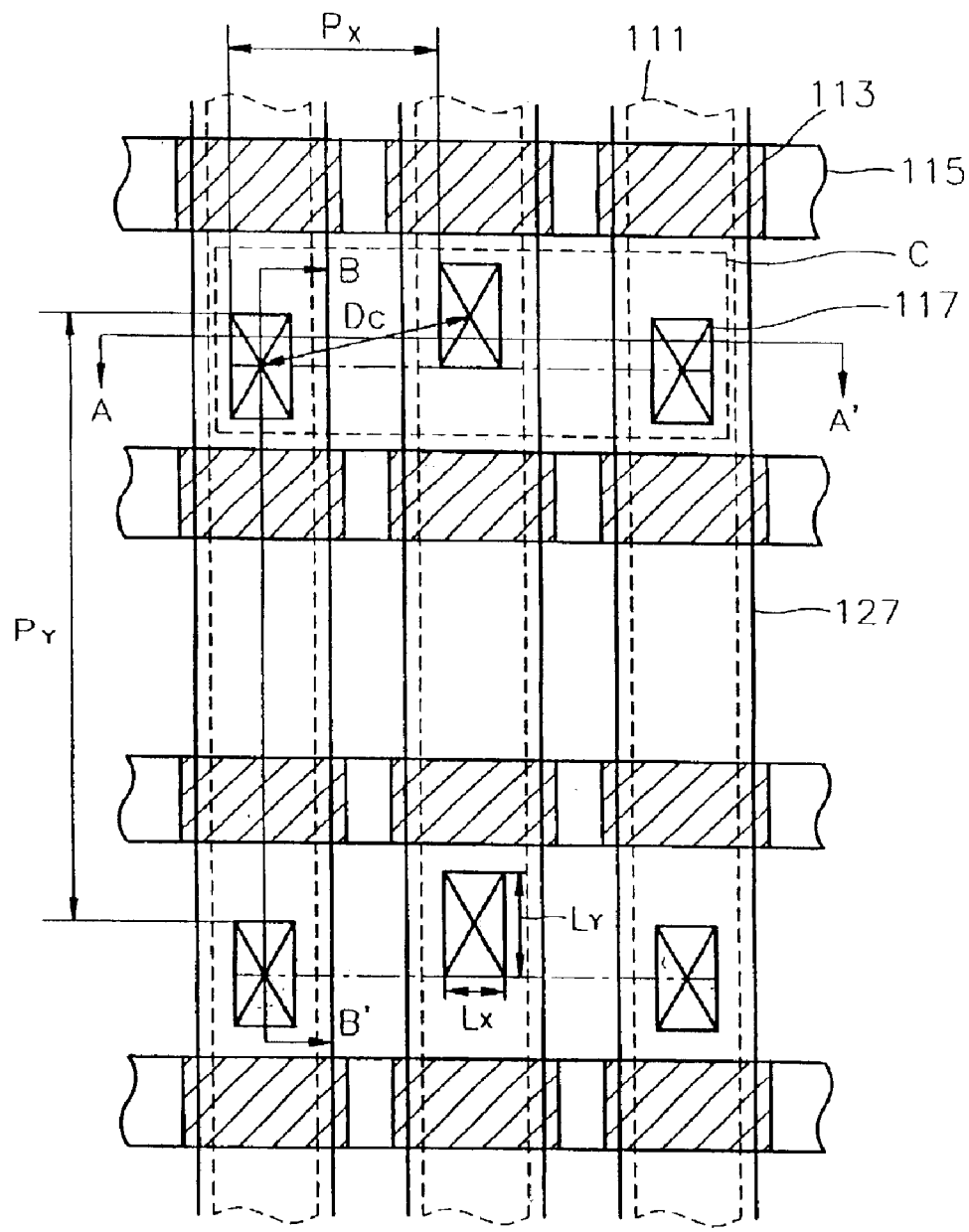
FIG. 1 is a lay-out view of a NOR-type non-volatile memory device illustrating bit line contact hole images of a photomask according to a first embodiment of the present invention.

The present invention will be described more fully hereinafter with reference to the accompanying drawings in which preferred embodiments of the invention are shown. This invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will be understood that when an element such as a layer, region or substrate is referred to as being "on" another element, it can be directly on the other element or intervening elements may also be present. In contrast, when an element is referred to as being "directly on" another element, there are no intervening elements present. Like reference numerals refer to like elements throughout the drawings.

FIG. 1 is a lay-out view of a portion of the cell array region of a NOR-type nonvolatile memory device. Reference numeral 111 denotes active region images, reference numeral 113 denotes floating gate images, reference numeral 115 denotes control gate images functioning as a word line, reference numeral 117 denotes bit line contact hole images, and reference numeral 127 denotes bit line images.

The bit line contact hole images 117 are defined by the photomask according to the first embodiment of the present invention. The photoresist layer having transferred contact hole images can not be flowed when the bit line contact hole images 117 are arranged in a line in the direction of an axis X with a predetermined pitch according to the design rule of a highly-integrated NOR-type non-volatile memory device and projected on a photoresist layer. Therefore, the photomask according to the first embodiment of the present invention includes a plurality of bit line contact hole images 117 arranged so that the distance Dc between the centers of the bit line contact hole images 117 may be larger than the pitch Px in the direction of the axis X. Preferably, the bit line contact hole images 117 are arranged in a staggered row arrangement in the direction of the axis X. The pitch Px in the direction of the axis X is the same as the pitch between the bit line images 127, or otherwise is proportional to the pitch between the bit line images 127. Accordingly, in a case where the bit line contact hole images 117 are transferred onto the photoresist layer, sufficient photoresist for flowing exists around each of the transferred bit line contact hole images (see 117' of FIG. 2C), and the photoresist is flowed (see FIGS. 3A and 3C). In FIG. 1, the bit line contact hole images 117 are staggered such that the centers of every other one are in line with the top edges of the others. However, the degree of center movement is properly adjusted, with consideration of the degree of photoresist required to flow. In addition, like the embodiment in the case where the pitch Px in the direction of the axis X of the bit line contact hole images 117 is very small and a pitch Py in the direction of the axis Y is relatively larger than the pitch Px, if the length Lx of the small pitch becomes sufficiently small and the length Ly of large pitch becomes sufficiently large, enough photoresist to flow is obtained around the bit line contact hole images 117 (see 117' of FIG. 2C), and an area contacting the contact holes formed by contact hole images on the substrate is uniformly maintained.

Hereinafter, a method for fabricating a NOR type nonvolatile memory device having reduced-size small bit line contact holes by using the photomask according to the first embodiment of the present invention will be described with reference to FIGS. 2A through 3.

Figure 2A:
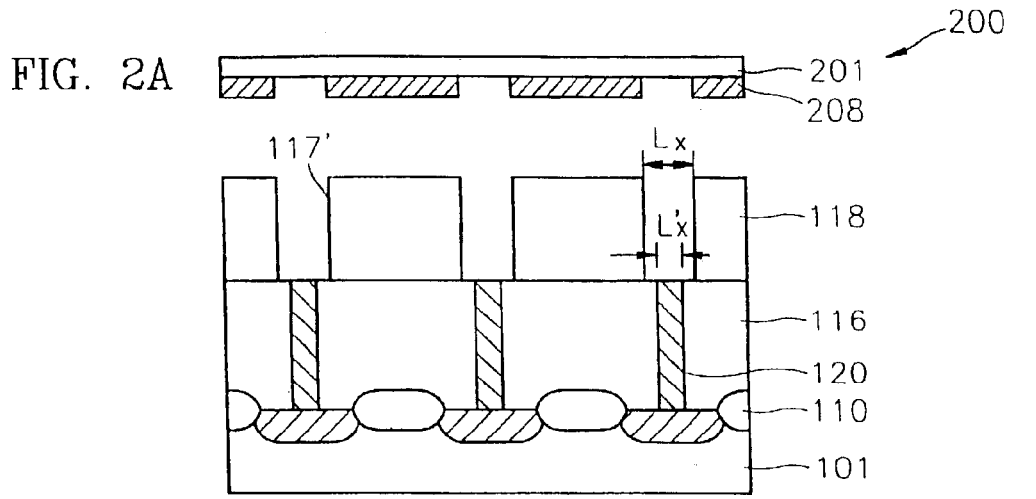
FIGS. 2A and 2B are sectional views illustrating a photomask according to the first embodiment of the present invention, and illustrating the NOR-type non-volatile memory device where the photoresist layer having the bit line contact hole images transferred from the photomask is formed.
Figure 2B:
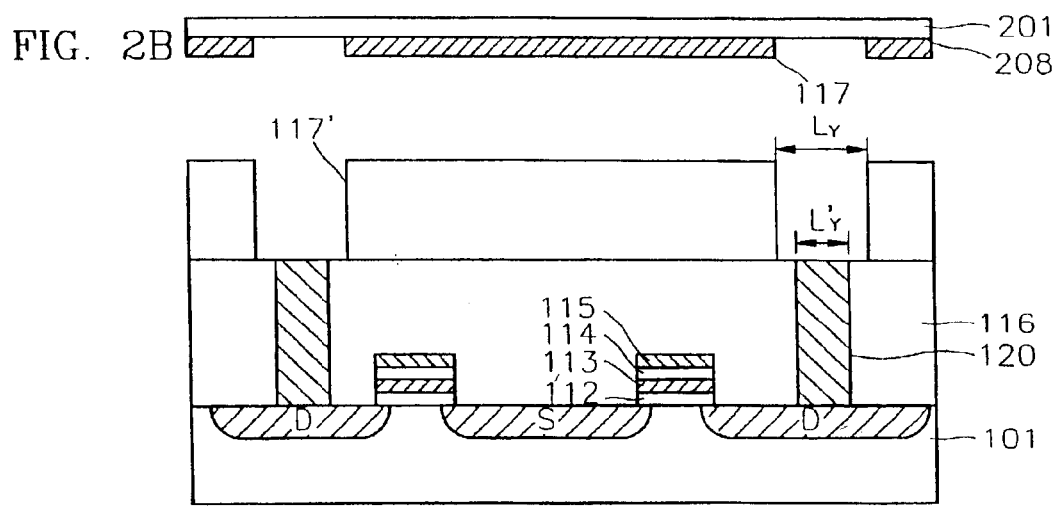

First, referring to FIGS. 2A and 2B, a field oxide layer 110 is formed on a semiconductor substrate 101 by using the photomask having the active region images 111, for example as shown in FIG. 1. Subsequently, a stacked gate, in which a gate oxide layer 112, a floating gate 113, an intergate dielectric layer 114 and a control gate 115 are stacked on an active region defined by the field oxide layer 110, is formed by using the photomask having the floating gate images and the photomask having the control gate images in sequence. After a source region S and a drain region D are formed, an interdielectric layer 116 is formed on the stacked gate. Subsequently, a photolithographic process for forming the bit line contact holes exposing the drain region D is performed.

Figure 2C:
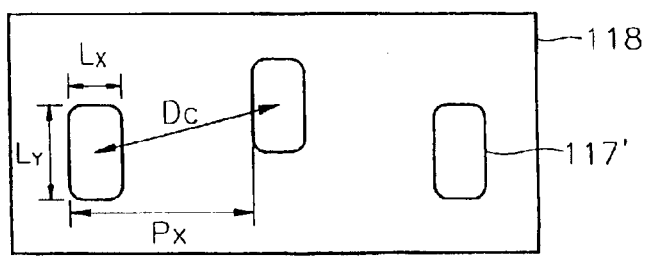
FIG. 2C is a plan view of the photoresist layer formed in a region C of FIG. 1 which has the bit line contact hole images transferred from the photomask.

First, the photoresist layer is formed on the interdielectric layer 116. After that, the photoresist layer is exposed to light by using the photomask 200 in which a shielding layer 208 having a plurality of the bit line contact hole images 117 is formed on a transparent substrate 201. As a result of exposure, the bit line contact hole images 117 of the photomask 200 are transferred onto the photoresist layer. The photoresist layer 118 having the bit line contact hole images 117' transferred from the photomask through the developing process is completed. The lengths Lx and Ly of the transferred bit line contact hole images 117' correspond to photolithographic resolution limit size and thus, they are larger than the lengths Lx' and Ly' of bit line contact holes 120 to be formed in the interdielectric layer 116. As shown in FIG. 2C, which illustrates a plan view of the photoresist layer 118 having the transferred bit line contact hole images 117', since the distance Dc between the centers of the bit line contact hole images 117' is larger than the pitch Px of the bit line contact hole images 117', sufficient photoresist to result in flow exists around the bit line contact hole images 117'.

Figure 3A:
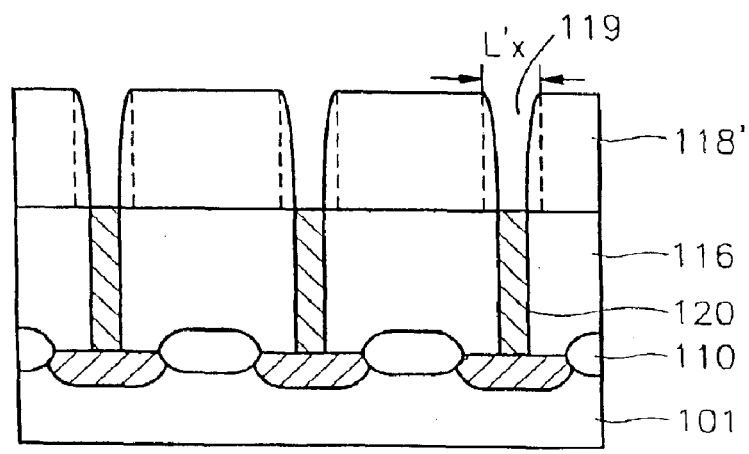
FIGS. 3A and 3B are sectional views of the NOR-type non-volatile memory device illustrating results, in which the photoresist layer of FIGS. 2A and 2B is flowed.
Figure 3B:
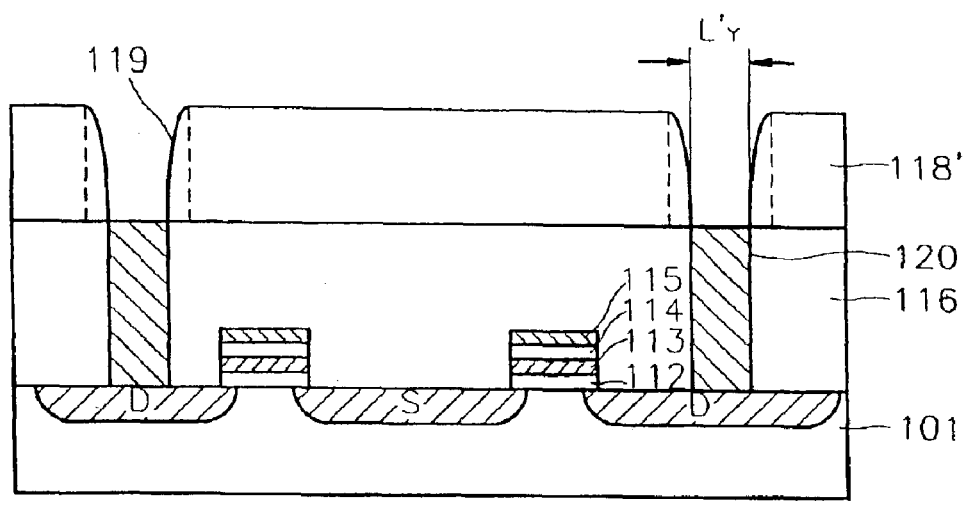
Figure 3C:
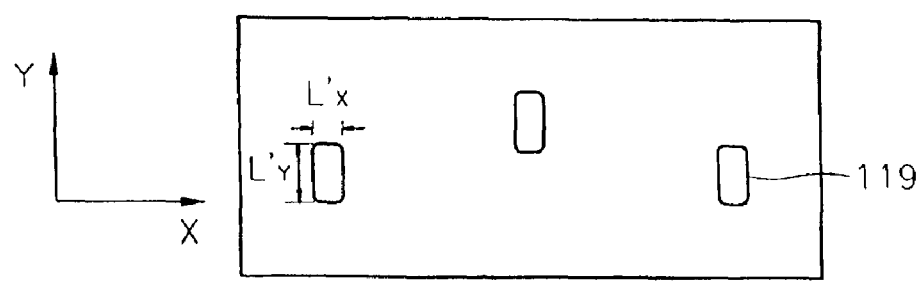
FIG. 3C is a plan view of the photoresist layer having reduced size images of openings by a flow process.

After that, as shown in FIGS. 3A through 3C, the bit line contact hole images 117' of the photoresist layer 118 are reduced through the photoresist flow process. At this time, the size of the reduced bit line contact hole images 119 is preferably below (width: L'x, length: L'y) the resolution limit of the photolithographic process. The photoresist flow process is performed by applying thermal energy for a given time to the photoresist 118 to reach a temperature above the glass transition temperature Tg of the photoresist. Last, the interdielectric layer 116 is etched by using the photoresist layer 118' having the reduced bit line contact hole images 119 for an etching mask, and the bit line contact holes 120 are completed.

Figure 4:
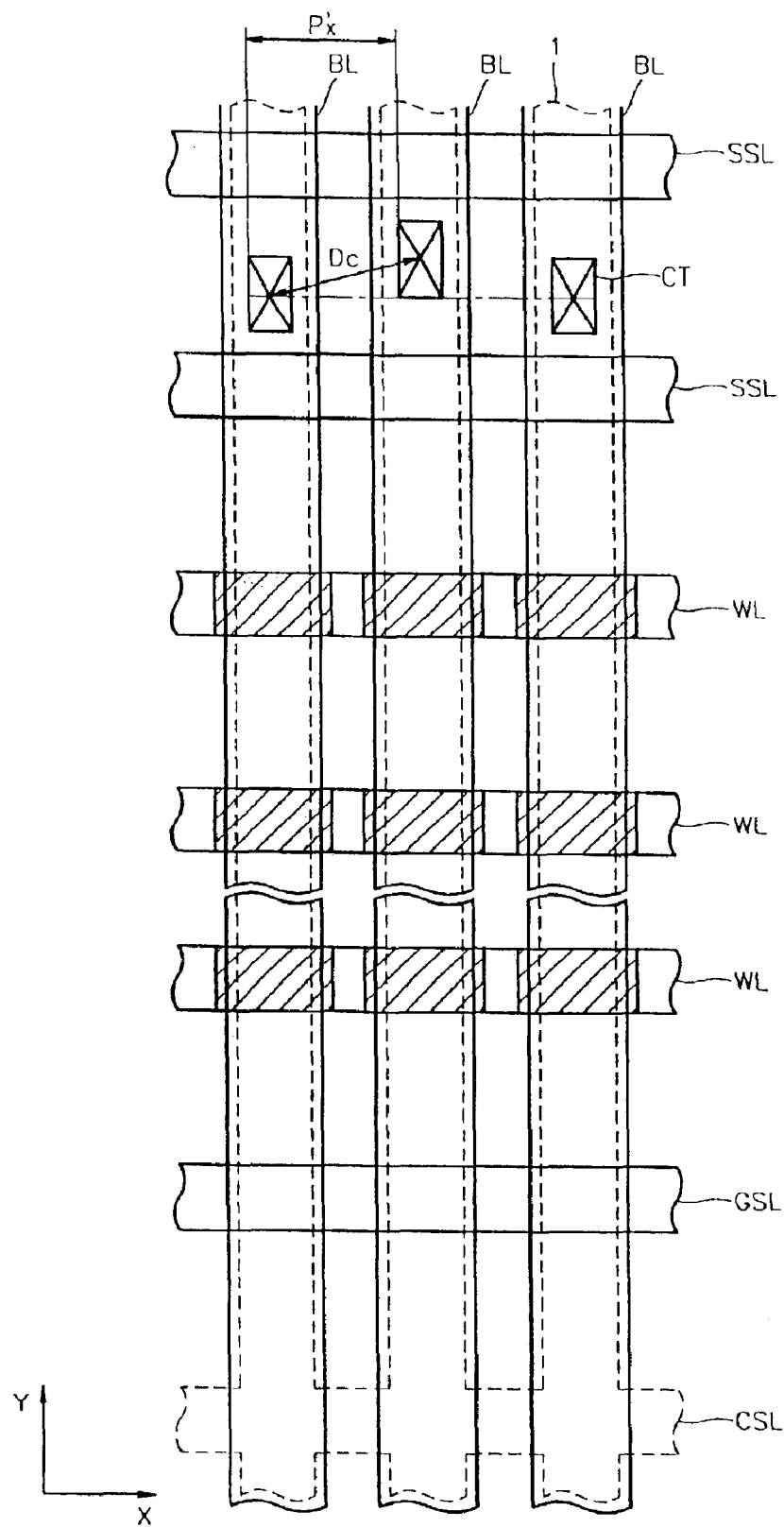
FIG. 4 is a lay-out view of a NAND-type non-volatile memory device illustrating bit line contact hole images of a photomask according to a second embodiment of the present invention.

FIG. 4 is a lay-out view of a portion of the cell array region of a NAND-type nonvolatile memory device. Reference numeral 1 denotes active region images, CSL denotes common source line images, SSL denotes string selection line images across the active region images 1, WL denotes word line images, GSL denotes ground selection line images, and CT denotes bit line contact hole images.

The bit line contact hole images CT are defined by the photomask according to the second embodiment of the present invention, and like the bit line contact hole images (see 117 of FIG. 1) of the NOR-type non-volatile memory device defined by the photomask according to the first embodiment of the present invention, the bit line contact hole images CT are arranged so that the distance Dc between the centers of the bit line contact images CT may be larger than the pitch P'x in the direction of the axis X. Comparing with the NOR-type non-volatile memory device, in the case of a NAND-type non-volatile memory device, the pitch in the direction of the axis X, that is, bit line pitch, is a primary factor affecting the distance between the bit line contact hole images CT. Accordingly, the ratio of length to width of the bit line contact hole images CT can be larger than that of the first embodiment.

Figure 5:
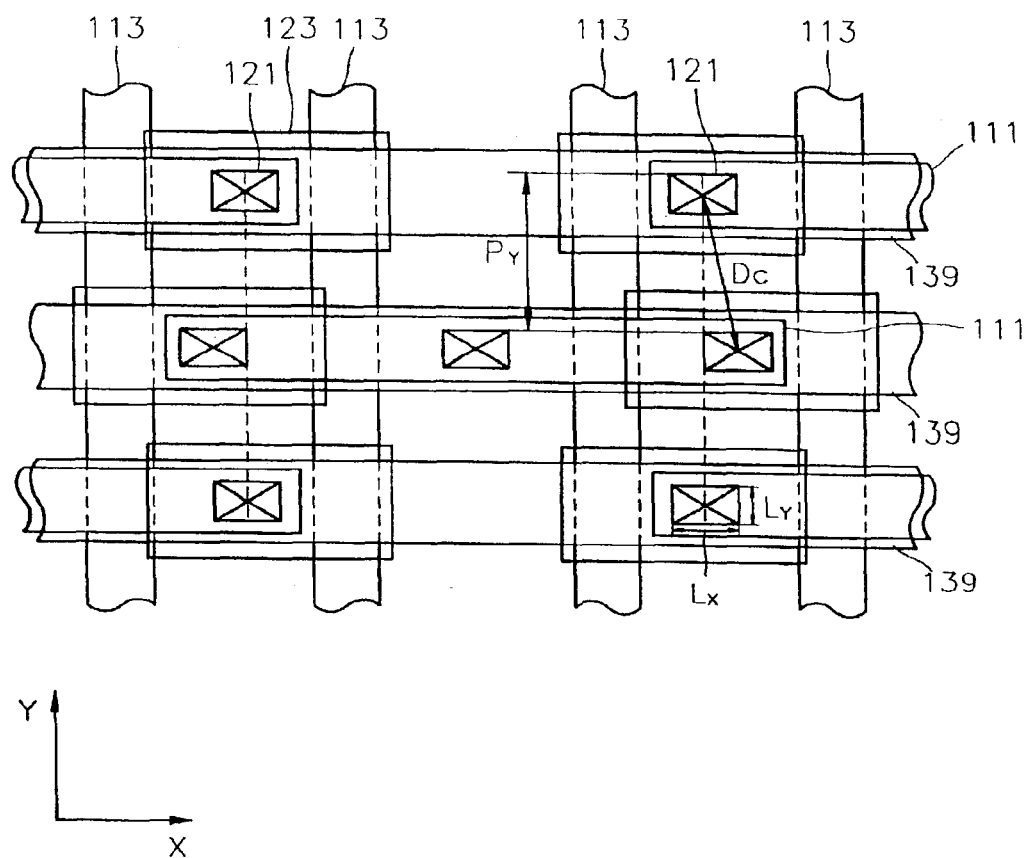
FIG. 5 is a lay-out view of a dynamic random access memory (DRAM) device illustrating storage electrode contact hole images of a photomask according to a third embodiment of the present invention.

FIG. 5 is a lay-out view of a portion of the cell array region of a DRAM device. Reference numeral 111 denotes active region images, reference numeral 113 denotes gate electrode images, reference numeral 121 denotes storage electrode contact hole images, reference numeral 123 denotes storage electrode images, and reference numeral 139 denotes bit line images.

The storage electrode contact hole images 121 are defined by the photomask according to the third embodiment of the present invention, and the minimum design rule for high integration is applied to the pitch Py in the direction of the axis Y. Therefore, the photomask according to the third embodiment of the present invention includes the storage electrode contact hole images 121 arranged so that the distance Dc between the centers may be larger than that of the pitch Py in the direction of the axis Y in order to apply the photoresist flow process with the photolithographic process for forming storage electrode contact holes. Since the distance between the storage electrode contact hole images 121 is great enough in the direction of the axis X, the length Lx of the storage electrode contact hole images 121 is preferably formed to be larger than the length Ly.

If the DRAM device is fabricated by using the photomask according to the third embodiment of the present invention and by performing the photolithographic process employing the photoresist flow process, storage electrode contact holes can be reduced to the size smaller than the resolution limit.

In the above-described embodiments, a photomask having contact hole images is described, but the present invention can be applied to a photomask having via hole images for interconnections, that is, a photomask having various kinds of images of openings to be fabricated.

The present invention will be described in more detail with reference to the following Examples. These Examples should not be construed as limiting the scope of the present invention.

EXAMPLE 1

In a case where a plurality of contact hole images are arranged in one direction with a predetermined pitch, the effect of which the distance between the contact hole images on the flow of the photoresist was measured in the following Example. A plurality of contact hole images having a width and length of 0.25 µm, respectively, were provided. That is, five photomasks, in which the distances between the contact hole images were 1.5 µm, 0.65 µm, 0.375 µm, 0.25 µm, and 0.2 µm, respectively, were provided. Subsequently, the photolithographic process was performed with each photomask, and the contact hole images were transferred onto the 1 µm thick photoresist layer, and the photoresist flow process was performed for 180 seconds at 150° C., and then, the flow quantity of the photoresist was measured. The measured results are shown in FIG. 6. In a case where the distance between the contact hole images was less than 0.25 µm from the results of FIG. 6, it was understood that the photoresist did not flow.

EXAMPLE 2

A photomask having contact hole images of width 0.24 µm and length 0.40 µm, arranged with a 0.48 µm pitch and formed in a staggered row arrangement so that the distance between the centers of the contact hole images might be larger than the pitch, as shown in FIG. 1, was provided. In particular, the contact hole images were arranged so that only a half region of the contact hole images would overlap in the direction of the pitch. The photoresist (SE4103P, manufactured by Shinessu) was coated to a thickness of 1 µm on the substrate, and baked at 90° C., and DUV was used as exposure source, and the photoresist layer was exposed to light using the photomask. Subsequently, post-baking was performed at 110° C., and the exposed portions were removed by a developer, and a photoresist layer having the transferred contact hole images was formed. After that, the photoresist layer was flowed by heat-treating for 180 seconds at 150° C. above the glass transition temperature of the photoresist. The size of the contact hole images in the photoresist layer after flow was measured. From the measured results, it was understood that the size of the contact hole images in the photoresist layer was reduced to width 0.16 µm and length 0.17 µm, considerably smaller than the contact hole images on the photomask.

According to the present invention, the photomask includes a plurality of images of openings arranged so that the distance between the centers of the images of openings may be larger that the pitch. Therefore, even if the highly-integrated images of openings of the photomask are transferred onto the photoresist layer, the photoresist can flow, and thereby, the size of the images of openings can be reduced. Accordingly, small openings below the resolution limit can be formed.

What is claimed is:

1. A photolithographic method for fabricating openings in a semiconductor memory device, the method comprising:

forming a photoresist layer having a plurality of images of openings transferred to the photoresist layer using a photomask and arranged in a row direction along a row axis, wherein images of neighboring openings in the row direction have a predetermined pitch along the row axis, and wherein the distance between centers of the images of neighboring openings is larger than the pitch, each of the images of openings of the photoresist layer having a length and a width;

reducing the length and the width of the images of openings of the photoresist layer by flowing the photoresist layer; and forming reduced size openings in an underlying layer of the semiconductor memory device by using the reduced images of the openings of the flowed photoresist layer as a mask, wherein the pitch in the row direction is less than a threshold pitch in the row direction, the threshold pitch being a smallest distance at which the images of neighboring openings in the row direction are sufficiently spaced for successful operation of the step of reducing the length and width of the images of the openings by flowing the photoresist layer.

2. The photolithographic method according to claim 1, wherein the step of forming the photoresist layer is performed by using the photomask including a plurality of images of openings corresponding to the plurality of images of openings arranged in the row direction with the predetermined pitch, and wherein the distance along the row axis between the centers of the images of neighboring openings of the photomask is larger than the pitch.

3. The photolithographic method according to claim 1, wherein the centers of the neighboring images of openings are spaced apart by a distance in a column direction along a column axis that is transverse to the row axis.

4. The photolithographic method according to claim 1, wherein the images of openings have a length in a column direction larger than a width in the row direction.

5. The photolithographic method according to claim 1, wherein the semiconductor memory device is a non-volatile memory device, and the images of openings are bit line contact hole images.

6. The photolithographic method according to claim 1, wherein the semiconductor memory device is a DRAM device, and the images of openings are storage electrode contact hole images.

7. A semiconductor memory device including openings fabricated according to claim 1.

* * * * *